United States Patent
Nahas

(10) Patent No.: US 7,082,389 B2
(45) Date of Patent: Jul. 25, 2006

(54) METHOD AND APPARATUS FOR SIMULATING A MAGNETORESISTIVE RANDOM ACCESS MEMORY (MRAM)

(75) Inventor: Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 712 days.

(21) Appl. No.: 10/302,203

(22) Filed: Nov. 22, 2002

(65) Prior Publication Data
US 2004/0102943 A1 May 27, 2004

(51) Int. Cl.
*G06F 17/50* (2006.01)
(52) U.S. Cl. ...................................... 703/13
(58) Field of Classification Search ................ 365/158, 365/171, 173, 210, 211, 225; 703/5, 13
See application file for complete search history.

(56) References Cited

U.S. PATENT DOCUMENTS 5,867,405 A * 2/1999 Jiang et al. ................. 703/5
2002/0141232 A1 10/2002 Saito et al.

OTHER PUBLICATIONS

Wang Xiaoyan, Computer Modeling and Testing of Magnetic Random Access Memory, 2001, Thesis, National University Of Singapore, pp. 12, 16, 19, 20, 45, 50, 51, and 52.*

Bodhisattva Das and William C. Black, A Generalized HSPICE Macro-Model for Pinned Spin-Dependent-Tunneling Devices, Sep. 1999, IEEE Transactions On Magnetics, vol. 35, No. 5, pp. 2889-2891.*

Kim et al., Macro Model and Sense Amplifier for a MRAM, Dec. 2002, Journal of the Korean Physical Society, vol. 41, No. 6, pp. 896-901.*

Das et al., Universal HSPICE Macromodel For Giant Magnetoresistance Memory Bits, Jul. 2000, IEEE Transactions on Magnetics, vol. 36, No. 4, pp. 2062-2072.*

(Continued)

*Primary Examiner*—Paul L. Rodriguez
*Assistant Examiner*—Juan C. Ochoa
(74) *Attorney, Agent, or Firm*—Joanna G. Chiu; Daniel D. Hill

(57) ABSTRACT

A method and apparatus (500) for simulating a magnetoresistive random access memory (MRAM) (102) uses non-linear functions to model both non-linear magnetic tunnel junction (MTJ) effects and non-linear state switching effects. The method includes calculating a high threshold ($T_{HI}$) and a low threshold ($T_{LO}$) based on a function of the hard axis current ($I_H$). The easy axis current ($I_E$) is compared to the high threshold ($T_{HI}$). If the easy axis current is greater than the high threshold, the MTJ resistance ($R_{HI}$) is set to represent a stored high value. The easy axis current is compared to the low threshold. If the easy axis current is less than the low threshold, the MTJ resistance ($R_{LO}$) is set to represent a stored low value. By using non-linear functions to model the MTJ effects and switching effects, the behavior of an MRAM (102) can be more accurately simulated.

22 Claims, 4 Drawing Sheets

OTHER PUBLICATIONS

S. Bae et al., "Fabrication and Thermal-Chemical Stability of Magnetoresistive Random-Access Memory Cells Using $\alpha$-$Fe_2O_3$ Bottom Spin Valves," *IEEE Transactions on Magnetics*, Nov. 2001, p. 3960-3968, vol. 37, No. 6.

T. O. Cheung, "'Direct Charging' Charge Device Model Testing of Magnetoresistive Recording Heads," *EOS/ESD Symposium 97-398*, 1997, pp. 398-404.

M. Durlam, et al., "A Low Power 1Mbit MRAM Based on 1T1MTJ Bit Cell Integrated with Copper Interconnects," *Symposium on VLSI Circuits Digest of Technical Papers*, 2002, pp. 158-161.

B. A. Everitt et al., "Single-Domain Model for Pseudo Spin Valve MRAM Cells," *IEEE Transactions on Magnetics*, Sep. 1997, p. 3289-3291, vol. 33, No. 5.

P. K. George et al., "Head Parameter Sensitivity Study of the Intrinsic Field Reversal Time," *Journal of Applied Physics*, Apr. 15, 1999, p. 4979-4981, vol. 85, No. 8.

J. Mahdavi et al., "Dynamic Modeling of Non-Linear SRM Drive with PSPICE," *IEEE Industry Applications Society Annual Meeting*, New Orleans, Louisiana, Oct. 5-9, 1997, pp. 661-667.

A. Maxim et al., "A New Analog Behavioral SPICE Macromodel of Magnetic Components," *IEEE International Symposium on Industrial Electronics*, Guimarãs, Portugal, University of Minho, Jul. 7-11, 1997, pp. 183-188, vol. 2 of 3.

A. Maxim et al., "A Novel Behavioral Method of SPICE Macromodeling of Magnetic Components Including the Temperature and Frequency Dependencies," *IEEE Power Electronics Conference*, 1998, pp. 393-399.

T. Sugawara et al., "A Nonlinear Model for Magnetic Recording Channel with an MR Head," *IEEE Transactions on Magnetics*, Jan. 1998, p. 57-62, vol. 34, No. 1.

A. Wallash, "Field-Induced Charged Device Model Testing of Magnetoresistive Recording Heads," *EOS/ESD Symposium*, 1996, pp. 8-13.

A. Wallash et al., "ESD Evaluation of Tunneling Magnetoresistive (TMR) Devices," *EOS/ESD Symposium*, 2000, pp. 470-474.

\* cited by examiner

METHOD AND APPARATUS FOR SIMULATING A MAGNETORESISTIVE RANDOM ACCESS MEMORY (MRAM)

FIELD OF THE INVENTION

The present invention relates generally to circuit simulations, and more particularly, to simulating magnetoresistive random access memories (MRAMs).

BACKGROUND OF THE INVENTION

Since manufacturing of circuits is costly, it is desirable to test the circuit design prior to manufacturing to ensure that a circuit will operate correctly. For example, circuit simulations may be performed on a circuit design to determine currents and voltages at various nodes within the circuit design. In order to perform circuit simulations on circuit designs, though, the circuit simulator needs access to circuit models of the various elements within the circuit design. That is, a circuit model provides a representation of a physical circuit element by describing its structure and operation. These circuit models may, in the ease of complex circuit elements, be simplified representations of the physical element. However, oversimplified circuit models, while reducing design and test time, may result in inaccurate testing results. For example, simulations of Magnetoresistive Tunnel Junction (MJT) MRAMs available today use simple resistors to model the resistance within the MRAMs, thus not taking into account the nonlinear effects of the resistance. Furthermore, the simulations of MRAMs available today do not take into account the actual switching of the memory. This oversimplified model leads to errors in the circuit design. Therefore, there is a need for an improved circuit model for MRAMs which models both the switching of the MTJ and the different non-linear tunnel junction resistances in both states of the memory in order to improve simulation of MRAMs.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

For improved simulation of MRAMs, a simulation model of an MRAM cell should take into account both the switching of the magnetoresistive tunnel junction (MTJ) and the different non-linear tunnel junction resistances in both states of the memory. Therefore, one embodiment of the present invention discussed herein relates to a method for simulating an MRAM which includes calculating a high threshold and a low threshold based on a function of a hard axis current or magnetic field. The easy axis current is then compared to the high threshold. If the easy axis current is greater than the high threshold, the MTJ resistance is set to represent a stored high value. The easy axis current is also compared to the low threshold. If the easy axis current is less than the low threshold, the MTJ resistance is set to represent a stored low value. By using non-linear functions to model the MTJ effects and switching effects, the behavior of an MRAM can be more accurately simulated.

Figure 1:
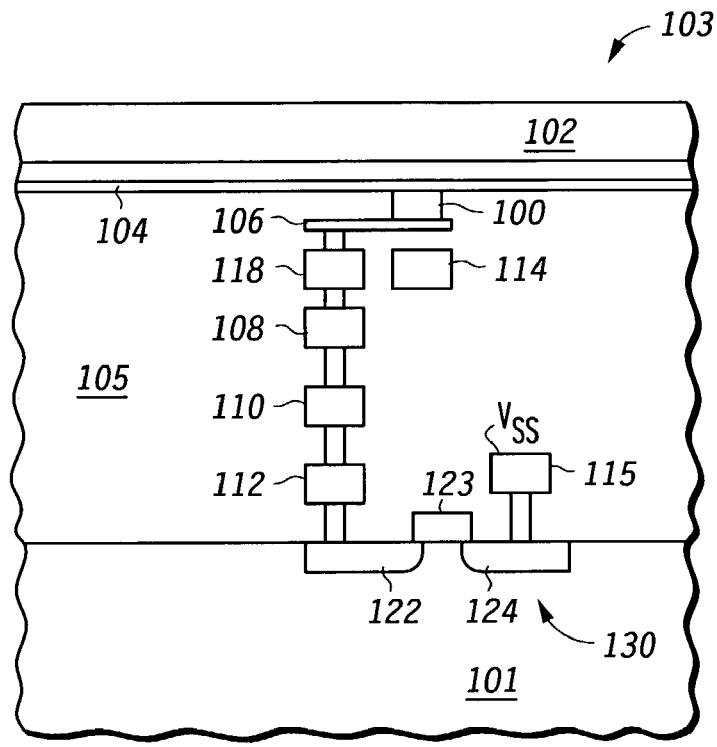
FIG. 1 illustrates a cross-sectional view of one embodiment of an MRAM memory cell.

FIG. 1 illustrates a cross-sectional view of one embodiment of an MRAM memory cell 103. Memory cell 103 includes a first metal line 102, and a second metal line 104, running parallel to first metal line 102. As illustrated in FIG. 1, an insulator layer is present between first metal line 102 and second metal line 104, where first metal line 102 and second metal line 104 may be different materials. Note that in alternate embodiments, first metal line 102 and second metal line 104 may be a same metal line of a same material. Memory cell 103 also includes and MTJ 100 connected to second metal line 104 and a third metal line 106, below MTJ 100. Also below MTJ 100, but electrically isolated from MTJ 100, is a fourth metal line 114 which runs substantially perpendicular to first metal line 102. That is, MTJ 100 is sandwiched between substantially orthogonal metal lines 102 and 114. Memory cell 103 also includes a transistor 130 formed within substrate 101. Transistor 130 includes a first current electrode 122 and a second current electrode 124, both formed in substrate 101, and a control electrode 123 overlying substrate 101. The third metal line 106 is connected to first current electrode 122 of transistor 130 by interconnect 118, interconnect 108, interconnect 110, and interconnect 112. Second current electrode 124 is connected to an interconnect 115, which, in the current embodiment, is connected to Vss. Note that MTJ 100, third metal line 106, interconnects 118, 108, 110, 112, and 115, and fourth metal line 114 are all formed within an insulating layer 105 located between substrate 101 and second metal line 104. (Also, note that the first, second, third, and fourth conductor lines may also be referred to as the first, second, third, and fourth conductors, respectively.)

Figure 2:
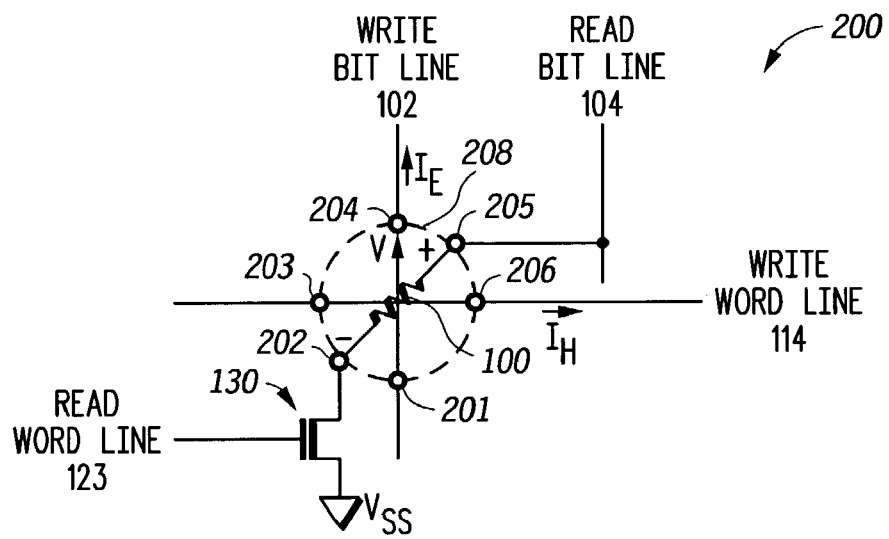
FIG. 2 illustrates a schematic representation of the MRAM memory cell of FIG. 1.

FIG. 2 illustrates, in schematic form, a memory cell 200 which is a schematic representation of memory cell 103 where like numerals indicate similar elements. Memory cell 200 includes write bit line 102 (corresponding to first metal line 102), read bit line 104 (corresponding to second metal line 104), write word line 114 (corresponding to fourth metal line 114), and read word line 123 (corresponding to control electrode 123 of transistor 130 in FIG. 1). Memory cell 200 also includes transistor 130 coupled between Vss and resistor 100 (where resistor 100 corresponds to MTJ 100 of FIG. 1). Memory cell 200 includes six terminals 201–206. Terminals 202 and 205 correspond to the connection of third metal line 106 to MTJ 100 of FIG. 1 and the connection of MTJ 100 to second metal line 104 of FIG. 1, respectively.

Terminals 201 and 204 correspond to a point along first metal line 102 at a left edge of memory cell 103 (in FIG. 1) and a point along first metal line 102 at a right edge of memory cell 103 (in FIG. 1), respectively. Terminals 203 and 206 corresponds to a point along fourth metal line 114 located at a front edge of memory cell 103 and a point along fourth metal line 114 located at a back edge of memory cell 103. Therefore, the lines defined between terminals 204 and 201 and between terminals 203 and 206 in FIG. 2 are orthogonal to each other, as can be seen by orthogonal metal lines 102 and 114 in FIG. 1.

In one embodiment, MTJ 100 (represented as a resistor in FIG. 2), includes a first magnetic layer, a dielectric layer, and a second magnetic layer, where the dielectric layer is sandwiched between the first and second magnetic layers. The first magnetic layer is made of a hard magnetic material and the second magnetic layer is made of a soft magnetic material, as compared to the hard magnetic material. When both the hard magnetic material and the soft magnetic material are magnetized in the same direction, MTJ 100 has a first resistance. However, when the hard magnetic material and the soft magnetic material are magnetized in opposite directions, MTJ 100 has a second resistance, greater than the first resistance. That is, the resistance of MTJ 100 differs depending on the magnetization of the first and second magnetic layers. (Note that the first magnetic layer may be located above or below the second magnetic layer.)

In operation, a current in first metal line 102 creates a magnetic field at MTJ 100 and a current in fourth metal line 114 also creates a magnetic field at MTJ 100. Since first metal line 102 and fourth metal line 114 are orthogonal, the magnetic fields created by the currents in these lines are also orthogonal. If the magnetic materials of the first and second magnetic layers of MTJ 100 are oriented such that the magnetic fields at MTJ 100 are parallel to fourth metal line 114, then first metal line 102 is defined as an easy axis and fourth metal line 114 is defined as a hard axis. Likewise, if the magnetic materials of MJT 100 are oriented such that the magnetic fields at MTJ 100 are parallel to the first metal line 102, then first metal line 102 is defined as the hard axis and fourth metal line 114 as the easy axis. (Note that in the current embodiment, it is assumed that first metal line 102 is the easy axis and fourth metal line 114 is the hard axis.) If the current in the easy axis, $I_E$, surpasses a high threshold, $T_{HI}$, the soft magnetic material in MTJ 100 will be magnetized opposite the magnetization of the hard magnetic material, thus resulting in a high resistance, $R_{HI}$. If $I_E$ falls below a low threshold, $T_{LO}$, the soft magnetic material in MTJ 100 will be magnetized in a same direction as the magnetization of the hard magnetic material, thus resulting in a low resistance, $R_{LO}$, as compared to $R_{HI}$. Therefore, $I_E$ is used to control the resistance state of memory cell 103 by controlling the magnetization of MTJ 100. (The arrow into terminal 204 in FIG. 2 corresponds to the direction of current within write bit line 102 necessary for writing the high resistance to memory cell 200.) Note that as used herein, $R_{HI}$ corresponds to a logic 1 stored in memory cell 103 and $R_{LO}$ corresponds to a logic 0 stored in memory cell 103. (However, note that alternate embodiments may define the logic states differently.) The current in the hard axis, $I_H$, can be used to lower the thresholds $T_{HI}$ and $T_{LO}$ by creating a magnetic field at MTJ 100 orthogonal to the magnetic field created by $I_E$ at MTJ 100. Transistor 130, controlled by read word line 123, is used to access or read the contents of memory cell 200. That is, when read word line 123 is asserted, the resistance of MTJ 100 can be sensed. Note that MRAM memory cell 103 and MRAM memory cell 200 operate as known by one of ordinary skill in the art, and therefore, the operation of memory cell 103 and 200 will only be described to the extent necessary for describing operation of FIG. 5.

Figure 3:
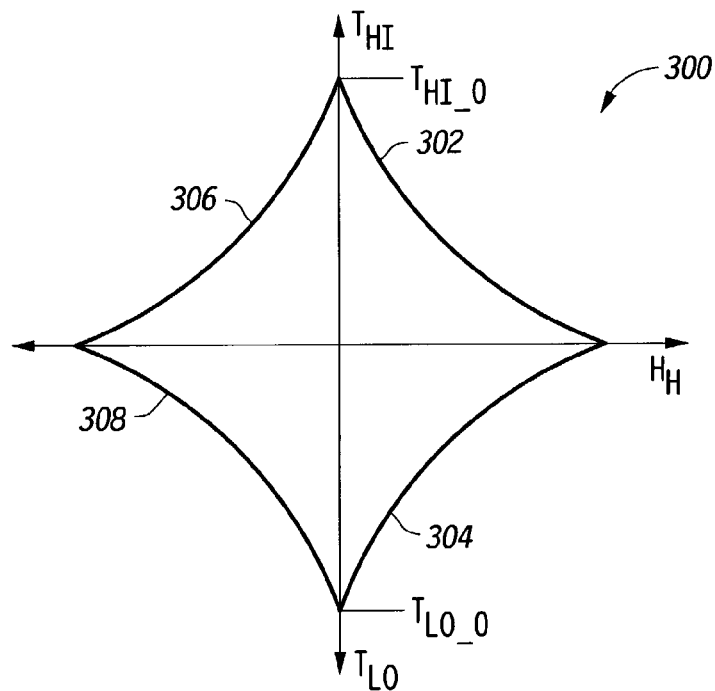
FIG. 3 illustrates, in graph form, a relationship between the magnetic field created by a current in a hard axis of the MRAM memory cell of FIG. 1 or 2 and high and low thresholds, in accordance with one embodiment of the present invention.

FIG. 3 illustrates a graph 300 representing a relationship between the magnetic field $H_H$ created by $I_H$ and the thresholds $T_{HI}$ and $T_{LO}$. (Note that the magnetic field created by $I_H$ and $I_H$ itself are linearly related such that $H_H = K^* I_H$.) For example, curves 306 and 302 provide values for $T_{HI}$ corresponding to values of $H_H$ while curves 308 and 304 provide values for $T_{LO}$ corresponding to values of $H_H$. Note that curves 302 and 304 provide values for $T_{HI}$ and $T_{LO}$ for a first direction of $H_H$ while curves 306 and 308 provide values for $T_{HI}$ and $T_{LO}$ for a second direction of $H_H$, opposite the first direction. Therefore, if the direction of $H_H$ is known, only half of graph 300 is necessary to define all the necessary values for $T_{HI}$ and $T_{LO}$ (either curves 302 and 304 or curves 306 and 308, depending on the direction of $H_H$).

Figure 4:
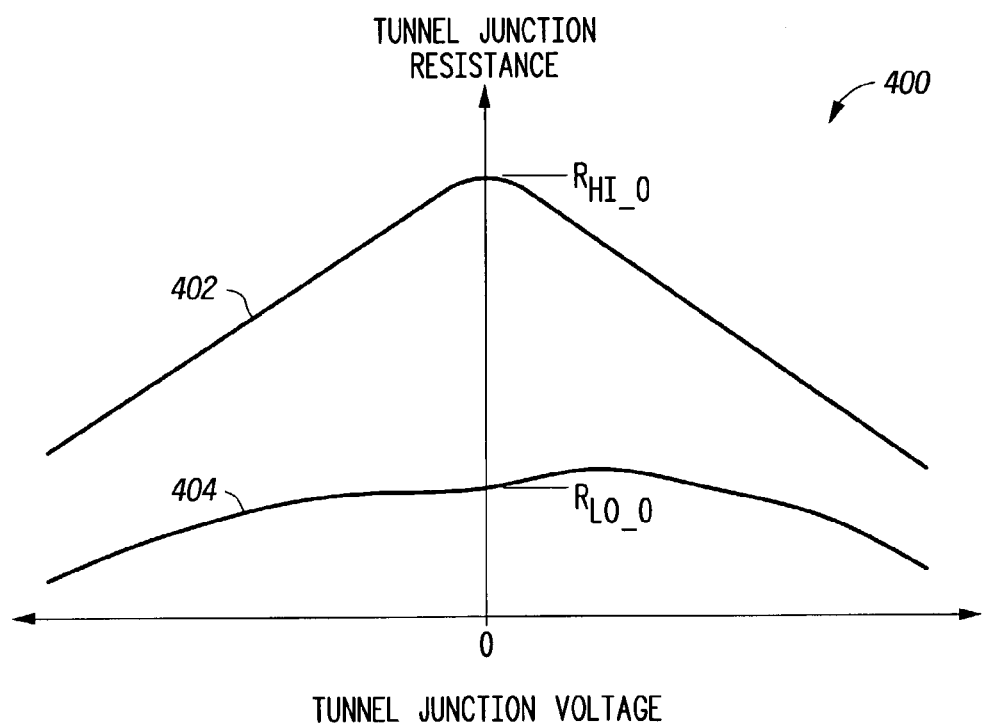
FIG. 4 illustrates, in graph form, a relationship between the tunnel junction voltage and the tunnel junction resistance of the MRAM memory cell of FIG. 1 or 2, in accordance with one embodiment of the present invention.

FIG. 4 illustrates a graph 400 representing the relationship between the tunnel junction voltage (i.e. voltage V across MJT 100, illustrated in FIG. 2 as the voltage between terminals 202 and 205) and the tunnel junction resistance (corresponding to resistor 100 of FIG. 2). Curve 404 corresponds to the tunnel junction resistance when MTJ 100 is in a low resistance state (that is, when MTJ 100 has a resistance of $R_{LO}$). Curve 402 corresponds to the tunnel junction resistance when MTJ 100 is in a high resistance state (that is, when MTJ 100 has a resistance of $R_{HI}$).

Figure 5:
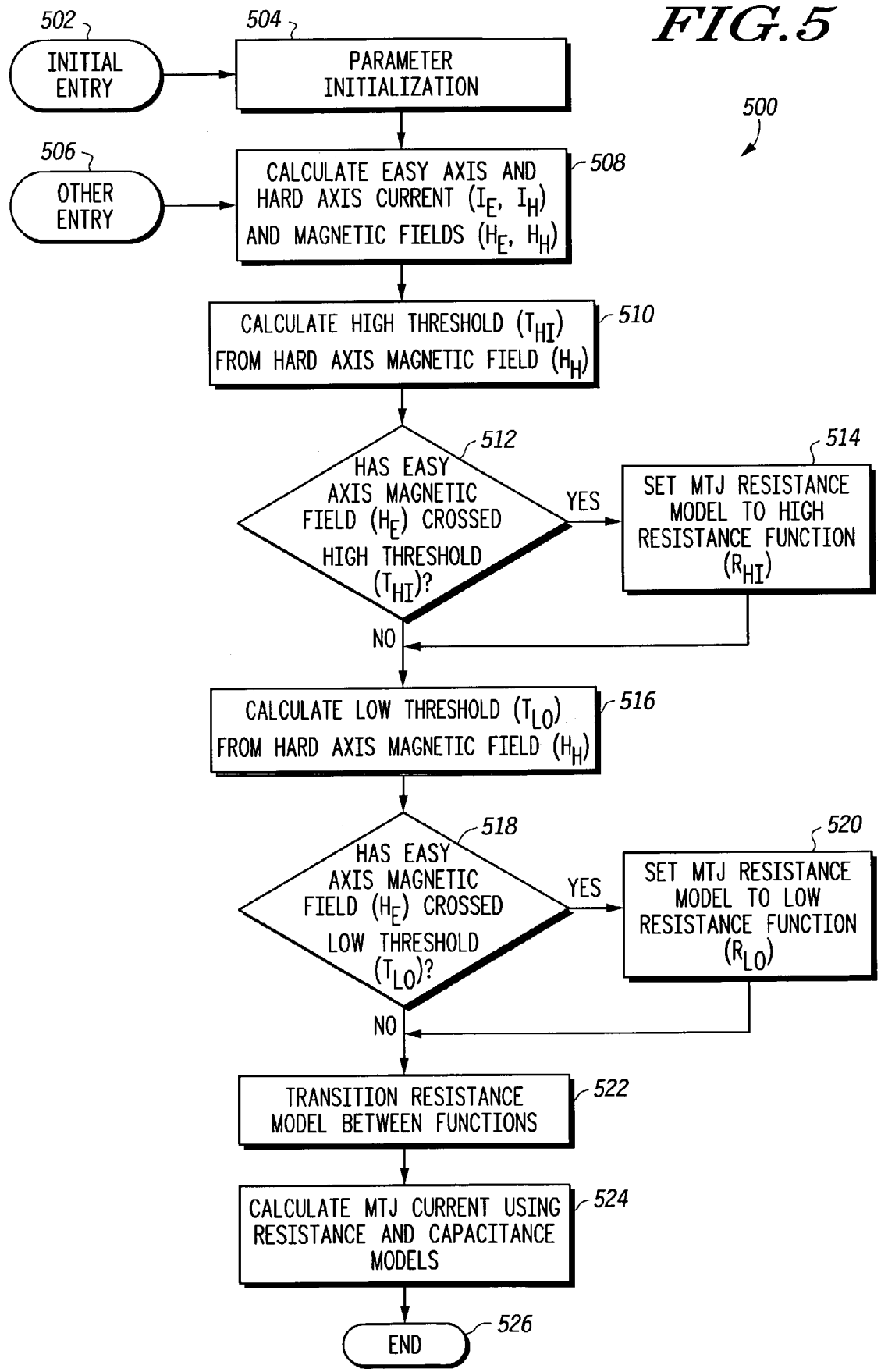
FIG. 5 illustrates, in flow diagram form, a method used for simulating an MRAM memory cell in accordance with one embodiment of the present invention.

FIG. 5 illustrates, in flow diagram form, a flow 500 used for simulating an MRAM memory cell, such as memory cell 103 or memory cell 200. As shown in FIG. 2, memory cell 200 can be described as a six terminal device (corresponding to terminals 201–206). The portion of memory cell 200 within the six terminals, as encircled by dotted line 208, corresponds to a symbol representative of a simulation model. This simulation model may be used in a circuit simulator where in each time step or other type of calculation iteration, the simulator can call the model represented by the portion of memory cell 200 encircled by dotted line 208 to calculate the voltage/current relationships for MTJ 100 of memory cell 200. Block 502 represents the initial entry into flow 500. Therefore, if the current entry is an initial entry into flow 500, flow begins with block 504 where the parameters used in the model are initialized. The parameters may include, for example, logic of state of memory and temperature adjustment of model parameter values. Flow then proceeds to block 508. Note that, as indicated by block 506, block 508 is the normal entry into flow 500 if initialization is not required. For example, during a time simulation of a particular circuit design, the parameters are generally initialized only once before the first time step. Therefore, upon starting up the simulator or beginning a new simulation, the parameters may be initialized.

In block 508, the easy axis and hard axis currents ($I_E$ and $I_H$, respectively) and magnetic fields ($H_E$ and $H_H$, respectively) are calculated. As discussed above, $I_H$ and $H_H$ are linearly related, as are $I_E$ and $H_E$, such that $H_E = K^* I_E$. The currents are calculated using Ohm's Law (V=I*R), and the magnetic fields are then calculated using the calculated currents. Flow then proceeds to block 510 where the high threshold, $T_{HI}$, is calculated based on $H_H$. In one embodiment, the following equation is used to determine $T_{HI}$.

Equation 1:  $T_{HI} = T_{HI\_0} * \max\left(\left(1 + K_1\left(\frac{H_H}{T_{HI\_0}}\right) + K_2\left(\frac{H_H}{T_{HI\_0}}\right)^2\right), K_{floor}\right)$ In the current embodiment, equation 1 represents a curve fit of curve 302 of FIG. 3. Note that in alternate embodiments, other functions based on $H_H$ may be used to determine $T_{HI}$. $T_{HI\_0}$ corresponds to the point where curve 302 intersects the $T_{HI}$ axis on graph 300. Therefore, $T_{HI\_0}$ may also be referred to as a zero hard axis field switching threshold. This represents the maximum value of $T_{HI}$. The max function selects the maximum of the calculated value determined by $$\left(1 + K_1\left(\frac{H_H}{T_{HI\_0}}\right) + K_2\left(\frac{H_H}{T_{HI\_0}}\right)^2\right)$$

and $K_{floor}$. This ensures that the value of $T_{HI}$ will not be less than $T_{HI\_0} * K_{floor}$, where $K_{floor}$ may also be referred to as a minimum switching threshold. This prevents the simulation model from entering an indeterminate state. Coefficients $K_1$ and $K_2$ are first and second order coefficients, respectively, determined from the curve fit algorithm. (Note that any curve fit algorithm may be used.)

Flow then proceeds to decision diamond 512, where it is determined whether $H_E$ has crossed $T_{HI}$ in the positive direction such that $H_E > T_{HI}$. $H_E$ is determined to have crossed $T_{HI}$, if, in a previous iteration, $H_E$ was < or $= T_{HI}$, and in the current iteration, $H_E$ is $> T_{HI}$. If $H_E$ has crossed $T_{HI}$, flow proceeds to block 514 where the resistance of MTJ 100 in the high resistance ($R_{HI}$) state is modeled as shown in the following equation.

Equation 2:  $R_{HI} = \frac{R_{HI\_0}}{1 + J_{HI\_1}V + J_{HI\_2}V^2 + J_{HI\_4}V^4}$ Equation 2 represents a curve fit of curve 402 of FIG. 4. Note that in alternate embodiments, other functions based on V (tunnel junction voltage) may be used to determine $R_{HI}$. $R_{HI\_0}$ corresponds to the point where curve 402 intersects the tunnel junction resistance axis on graph 400. Coefficients $J_{HI\_1}$, $J_{HI\_2}$, and $J_{HI\_4}$ are first, second, and fourth order coefficients, respectively, determined from the curve fit algorithm used. (Note that any curve fit algorithm may be used.) After block 514, or, if at decision diamond 512, $H_E$ was determined to not have crossed $T_{HI}$, flow proceeds to block 516 where the low threshold, $T_{LO}$, is calculated based on $H_H$. In one embodiment, the following equation is used to determine $T_{LO}$.

Equation 3:  $T_{LO} = T_{LO\_0} * \max\left(\left(1 + K_1\left(\frac{H_H}{T_{LO\_0}}\right) + K_2\left(\frac{H_H}{T_{LO\_0}}\right)^2\right), K_{floor}\right)$ In the current embodiment, equation 3 represents a curve fit of curve 304 of FIG. 3. Note that in alternate embodiments, other functions based on $H_H$ may be used to determine $T_{LO}$. $T_{LO\_0}$ corresponds to the point where curve 304 intersects the $T_{LO}$ axis on graph 300. Therefore, $T_{LO\_0}$ provides a negative value which represents the minimum value of $T_{LO}$. (Note that $T_{HI\_0}$ may also be referred to as a second zero hard axis field switching threshold.) The max function selects the maximum of the calculated value determined by $$\left(1 + K_1\left(\frac{H_H}{T_{LO\_0}}\right) + K_2\left(\frac{H_H}{T_{LO\_0}}\right)^2\right)$$

and $K_{floor}$. This ensures that the value of $T_{LO}$ will not be greater than $T_{LO\_0} * K_{floor}$. This prevents the simulation model from entering an indeterminate state. Coefficients $K_1$ and $K_2$ are first and second order coefficients, respectively, determined from the curve fit algorithm. (Note that any curve fit algorithm may be used.)

Flow then proceeds to decision diamond 518, where it is determined whether $H_E$ has crossed $T_{LO}$ in the negative direction such that $H_E < T_{LO}$. $H_E$ is determined to have crossed $T_{LO}$, if, in a previous iteration, $H_E$ was > or $= T_{LO}$, and in the current iteration, $H_E$ is $< T_{LO}$. If $H_E$ has crossed $T_{LO}$, flow proceeds to block 520 where the resistance of MTJ 100 in the low resistance ($R_{LO}$) state is modeled as shown in the following equation.

Equation 4:  $R_{LO} = \frac{R_{LO\_0}}{1 + J_{LO\_1}V + J_{LO\_2}V^2 + J_{LO\_4}V^4}$ Equation 4 represents a curve fit of curve 404 of FIG. 4. Note that in alternate embodiments, other functions based on V (tunnel junction voltage) may be used to determine $R_{LO}$. $R_{LO\_0}$ corresponds to the point where curve 404 intersects the tunnel junction resistance axis on graph 400. Coefficients $J_{LO\_1}$, $J_{LO\_2}$, and $J_{LO\_4}$ are first, second, and fourth order coefficients, respectively, determined from the curve fit algorithm used. (Note that any curve fit algorithm may be used.)

Note that the form of equations 2 and 4 are similar. Therefore, $R_{HI}$ and $R_{LO}$ may be obtained using the same function but varying the values of the four coefficients: $R_{x\_0}$, $J_{x\_1}$, $J_{x\_2}$, and $J_{x\_4}$. Also, note that generally, blocks 514 and 520 are mutually exclusive in that in any given iteration, $H_E$ may only cross one of the thresholds $T_{HI}$ or $T_{LO}$. Therefore, upon setting the resistance state in either block 514 or 520, the resistance state will not be changed again until the opposite threshold ($T_{LO}$ or $T_{HI}$, respectively) is crossed in some subsequent iteration.

After block 520, or, if at decision diamond 518, $H_E$ was determined to not have crossed $T_{LO}$, flow proceeds to block 522. Block 522 compares the resistance state of a previous iteration (or of the initialized value from block 504 if the current iteration is the first iteration) to the resistance state of the current iteration at this point. If the resistance state is the same, block 522 does nothing more and flow proceeds to block 524. However, if the resistance state is different, block 522 provides for a smooth transition between the resistance state of the previous iteration to the newly determined resistance state of the current iteration. For example, in one embodiment, this transition may occur over multiple iterations. A transition parameter may be used to determine how fast (e.g. over how many iterations or simulation time) this transition should occur. Also, in one embodiment, this transition is implemented by transitioning the values of the coefficients of the above equations 2 and 4 over time.

Flow then proceeds to block 524 where the current through the modeled MTJ is calculated using the MTJ resistance determined by equation 2 or 4 and standard linear capacitance models. (Note that these standard linear capacitance models are known in the art and will not be described in more detail herein.) Flow then ends at block 526. Therefore, it can be appreciated that flow 500 may be used to provide the current/voltage relationships of an MRAM memory cell. The simulator may perform flow 500 as needed during the circuit simulation. For example, for transient analysis, iterations of flow 500 may be executed at various time steps.

Figure 6:
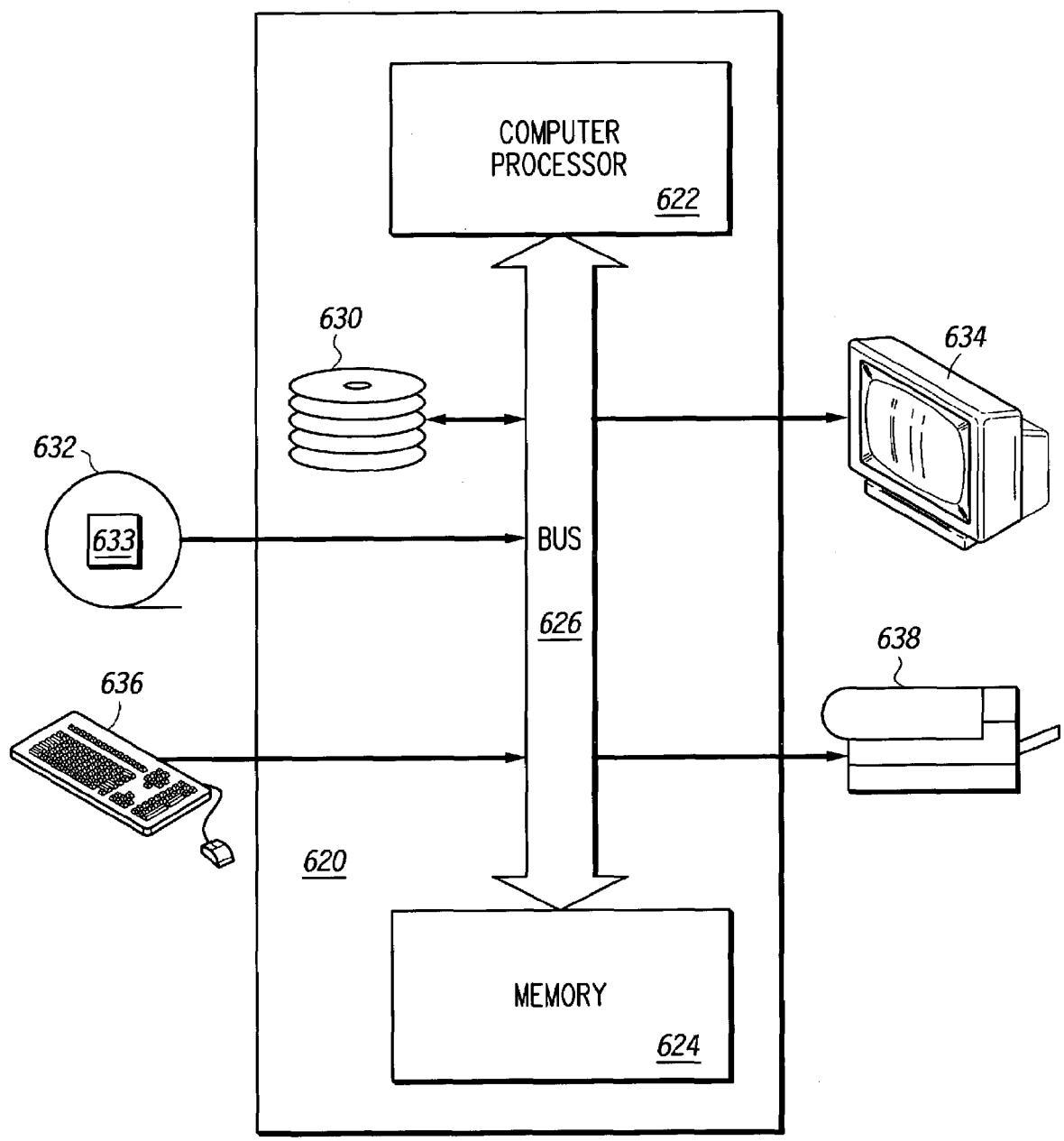
FIG. 6 illustrates, in block diagram form, a computer system in accordance with one embodiment of the present invention.

FIG. 6 illustrates, in block diagram form, a general purpose computer 620 in accordance with one embodiment of the present invention which may be used to execute the methods discussed herein. General purpose computer 620 includes a computer processor 622 and memory 624 coupled by a bus 626. Memory 624 may include relatively high speed machine readable media such as DRAM, SRAM, ROM, FLASH, EEPROM, bubble memory, etc. Also coupled to bus 626 are secondary storage 630, external storage 632, output devices such as a monitor 634, input devices such as a keyboard (with mouse) 636, and printers 638. Secondary storage 630 may include machine readable media such as hard disk drives, magnetic drum, bubble memory, etc. External storage 632 may include machine readable media such as floppy disks, removable hard drives, magnetic tap, CD-ROM, and even other computers, possibly connected via a communications line. It should be appreciated that there may be overlap between some elements, such as between secondary storage 630 and external storage 632. Executable versions of computer software 633, such as, for example, software for performing the MRAM simulation described herein, can be written to, and later read from external storage 632, loaded for execution directly into memory 624, or stored on secondary storage 630 prior to loading into memory 624 and execution. Also, the MRAM cell simulation model may be stored in secondary storage 630 or external storage 632.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. For example, any software taught herein may be embodied on one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the flow diagrams may also be arranged differently, include more or less steps, be arranged differently, or may have steps that can be separated into multiple steps or steps that can be performed simultaneously with one another. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed:

1. A method for simulating an integrated circuit magnetoresistive random access memory (MRAM) having a first conductor, a second conductor, and a magnetic tunnel junction (MTJ), the first conductor disposed substantially orthogonal to the second conductor, the MTJ disposed between the first conductor and the second conductor, comprising the steps of:
   calculating a first current in the first conductor;
   calculating a second current in the second conductor;
   calculating a first threshold, the first threshold being a first function of the first current;
   comparing the second current to the first threshold, if the second current is greater than the first threshold, setting a resistance of the MTJ to a first resistance value;
   calculating a second threshold, the second threshold being a second function of the first current;
   comparing the second current to the second threshold, if the second current is less than the second threshold, setting the resistance of the MTJ to a second resistance value; and
   calculating an MTJ current using the resistance of the MTJ.

2. The method of claim 1, wherein the first threshold represents a programming current threshold for programming a high logic state into a MRAM cell, and the second threshold represents a programming current threshold for programming a low logic state into the MRAM cell.

3. The method of claim 1, wherein the first resistance value is modeled using $R/(1+J_2V^2+J_4V^4)$, where R is a predetermined resistance of the MTJ, $J_2$ and $J_4$ are predetermined second and forth order coefficients, respectively, and V is a predetermined MTJ voltage value.

4. The method of claim 1, wherein the second resistance value is modeled using $R/(1+J_1V+J_2V^2)$, where R is a predetermined resistance of the MTJ, $J_1$ and $J_2$ are predetermined first and second order coefficients, respectively, and V is a predetermined MTJ voltage value.

5. The method of claim 1, wherein the first current is characterized as being a hard axis current and the second current is characterized as being an easy axis current.

6. The method of claim 5, wherein the easy axis current is used to switch between the first and second resistance values and the hard axis current is used to change the first and second thresholds.

7. The method of claim 1, wherein the first function of the first current and the second function of the first current are based on a magnetic field calculation where $$H_{TH}=H_{SW}*\max\ (1+K_1(H_H/H_{SW})+K_2((H_H/H_{SW})^2, K_{floor}))$$

and where $H_{TH}$ is a switching threshold magnetic field, $H_{SW}$ is a zero hard axis field switching threshold, $H_H$ is a predetermined hard axis field, $K_1$ is a first order coefficient, $K_2$ is a second order coefficient, and $K_{floor}$ is a minimum switching threshold.

8. A magnetoresistive random access memory (MRAM) simulator used to simulate a behavior of an MRAM having a first conductor, a second conductor, and a magnetic tunnel junction (MTJ), the first conductor disposed substantially orthogonal to the second conductor, the MTJ disposed between the first conductor and the second conductor, the simulator comprising:
   means for calculating a first current in the first conductor;
   means for calculating a second current in the second conductor;
   means for calculating a first threshold, the first threshold being a first function of the first current;
   means for comparing the second current to the first threshold, if the second current is greater than the first threshold, setting a resistance of the MTJ to a first resistance value;
   means for calculating a second threshold, the second threshold being a second function of the first current;
   means for comparing the second current to the second threshold, if the second current is less than the second threshold, setting the resistance of the MTJ to a second resistance value; and
   means for calculating an MTJ current using the resistance of the MTJ.

9. The simulator of claim 8, wherein the first threshold represents a programming current threshold for programming a high logic state into a MRAM cell, and the second threshold represents a programming current threshold for programming a low logic state into the MRAM cell.

10. The simulator of claim 8, wherein the first resistance value is modeled using $R/(1+J_2V^2+J_4V^4)$, where R is a predetermined resistance of the MTJ, $J_2$ and $J_4$ are predetermined second and forth order coefficients, respectively, and V is a predetermined MTJ voltage value.

11. The simulator of claim 8, wherein the second resistance value is modeled using $R/(1+J_1V+J_2V^2)$, where R is a predetermined resistance of the MTJ, $J_1$ and $J_2$ are predetermined first and second order coefficients, respectively, and V is a predetermined MTJ voltage value.

12. The simulator of claim 8, wherein the first current is characterized as being a hard axis current and the second current is characterized as being an easy axis current.

13. The simulator of claim 12, wherein the easy axis current is used to switch between the first and second resistance values and the hard axis current is used to change the first and second thresholds.

14. The simulator of claim 8, wherein the first function of the first current and the second function of the first current are based on a magnetic field calculation where $$H_{TH}=H_{SW}*\max (1+K_1(H_H/H_{SW})+K_2((H_H/H_{SW})^2, K_{floor}))$$

and where $H_{TH}$ is a switching threshold magnetic field, $H_{SW}$ is a zero hard axis field switching threshold, $H_H$ is a predetermined hard axis field, $K_1$ is a first order coefficient, $K_2$ is a second order coefficient, and $K_{floor}$ is a minimum switching threshold.

15. The simulator of claim 8, wherein the simulator is a computer program and the means for calculating and means for comparing are implemented using a data processing system.

16. A computer readable medium having stored instructions for simulating the behavior of a magnetoresistive random access memory (MRAM), the MRAM having a first conductor, a second conductor, and a magnetic tunnel junction (MTJ), the first conductor disposed substantially orthogonal to the second conductor, the MTJ disposed between the first conductor and the second conductor, the computer readable medium comprising:
   instructions for calculating a first current in the first conductor;
   instructions for calculating a second current in the second conductor;
   instructions for calculating a first threshold, the first threshold being a first function of the first current;
   instructions for comparing the second current to the first threshold, if the second current is greater than the first threshold, setting a resistance of the MTJ to a first resistance value;
   instructions for calculating a second threshold, the second threshold being a second function of the first current;
   instructions for comparing the second current to the second threshold, if the second current is less than the second threshold, setting the resistance of the MTJ to a second resistance value; and
   instructions for calculating an MTJ current using the resistance of the MTJ.

17. The computer readable medium of claim 16, wherein the first threshold represents a programming current threshold for programming a high logic state into a MRAM cell, and the second threshold represents a programming current threshold for programming a low logic state into the MRAM cell.

18. The computer readable medium of claim 16, wherein the first resistance value is modeled using $R/(1+J_2V^2+J_4V^4)$, where R is a predetermined resistance of the MTJ, $J_2$ and $J_4$ are predetermined second and forth order coefficients, respectively, and V is a predetermined MTJ voltage value.

19. The simulator of claim 16, wherein the second resistance value is modeled using $R/(1+J_1V+J_2V^2)$, where R is a predetermined resistance of the MTJ, $J_1$ and $J_2$ are predetermined first and second order coefficients, respectively, and V is a predetermined MTJ voltage value.

20. The simulator of claim 16, wherein the first current is characterized as being a hard axis current and the second current is characterized as being an easy axis current.

21. The simulator of claim 20, wherein the easy axis current is used to switch between the first and second resistance values and the hard axis current is used to change the first and second thresholds.

22. The simulator of claim 16, wherein the first function of the first current and the second function of the first current are based on a magnetic field calculation where $$H_{TH}=H_{SW}*\max (1+K_1(H_H/H_{SW})+K_2((H_H/H_{SW})^2, K_{floor}))$$

and where $H_{TH}$ is a switching threshold magnetic field, $H_{SW}$ is a zero hard axis field switching threshold, $H_H$ is a predetermined hard axis field, $K_1$ is a first order coefficient, $K_2$ is a second order coefficient, and $K_{floor}$ is a minimum switching threshold.

* * * * *